US012469665B2

(12) United States Patent
Kasuya et al.

(10) Patent No.: US 12,469,665 B2
(45) Date of Patent: Nov. 11, 2025

(54) CHARGED PARTICLE BEAM DEVICE

(71) Applicant: Hitachi High-Tech Corporation, Tokyo (JP)

(72) Inventors: Keigo Kasuya, Tokyo (JP); Shuhei Ishikawa, Tokyo (JP); Kenji Tanimoto, Tokyo (JP); Shunichi Watanabe, Tokyo (JP); Takashi Doi, Tokyo (JP); Yusuke Sakai, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 18/691,071

(22) PCT Filed: Oct. 19, 2021

(86) PCT No.: PCT/JP2021/038557
§ 371 (c)(1),
(2) Date: Mar. 12, 2024

(87) PCT Pub. No.: WO2023/067681
PCT Pub. Date: Apr. 27, 2023

(65) Prior Publication Data
US 2024/0379318 A1 Nov. 14, 2024

(51) Int. Cl.
*H01J 37/073* (2006.01)
*H01J 37/28* (2006.01)

(52) U.S. Cl.
CPC ............. *H01J 37/073* (2013.01); *H01J 37/28* (2013.01); *H01J 2237/04735* (2013.01); *H01J 2237/06341* (2013.01)

(58) Field of Classification Search
CPC ................................ H01J 37/073; H01J 37/04
See application file for complete search history.

(56) References Cited

U.S. PATENT DOCUMENTS

2007/0158588 A1 7/2007 Zhou et al.
2014/0239200 A1 8/2014 Miyamoto
(Continued)

FOREIGN PATENT DOCUMENTS

JP 50-012959 A 2/1975
JP 50-100964 A 8/1975
(Continued)

OTHER PUBLICATIONS

International Search Report of PCT/JP2021/038557 dated Dec. 14, 2021.
(Continued)

*Primary Examiner* — Joseph L Williams
(74) *Attorney, Agent, or Firm* — Mattingly & Malur, PC

(57) ABSTRACT

Provided is a charged particle beam device that can precisely manage a temperature at which a cold field emitter is heated. A charged particle beam device includes: a cold field emitter including a tip having a sharpened distal end, a filament connected to the tip, and an auxiliary electrode covering the filament and having an opening from which the tip protrudes; an extraction electrode to which an extraction voltage for extracting electrons from the cold field emitter is applied; and an acceleration electrode to which an acceleration voltage for accelerating the electrons extracted from the cold field emitter is applied. When the tip and the filament are heated, thermionic electrons emitted from the tip and the filament are collected by the auxiliary electrode to measure a current by applying a positive voltage with respect to the tip to the auxiliary electrode.

22 Claims, 13 Drawing Sheets

(56) References Cited

U.S. PATENT DOCUMENTS

| | | | | |
|---|---|---|---|---|
| 2014/0264019 | A1* | 9/2014 | Adamec ................ | H01J 37/073 315/15 |
| 2020/0090897 | A1* | 3/2020 | Kasuya ................. | H01J 37/075 |
| 2020/0312619 | A1 | 10/2020 | Mangnus et al. | |

FOREIGN PATENT DOCUMENTS

| | | | |
|---|---|---|---|
| JP | 57-165944 | A | 10/1982 |
| JP | 2007-073521 | A | 3/2007 |
| KR | 10-2014-0106429 | A | 9/2014 |

OTHER PUBLICATIONS

Korean Office Action received in corresponding Korean Application No. 10-2024-7008071 dated Apr. 22, 2025.

* cited by examiner

[FIG. 1]
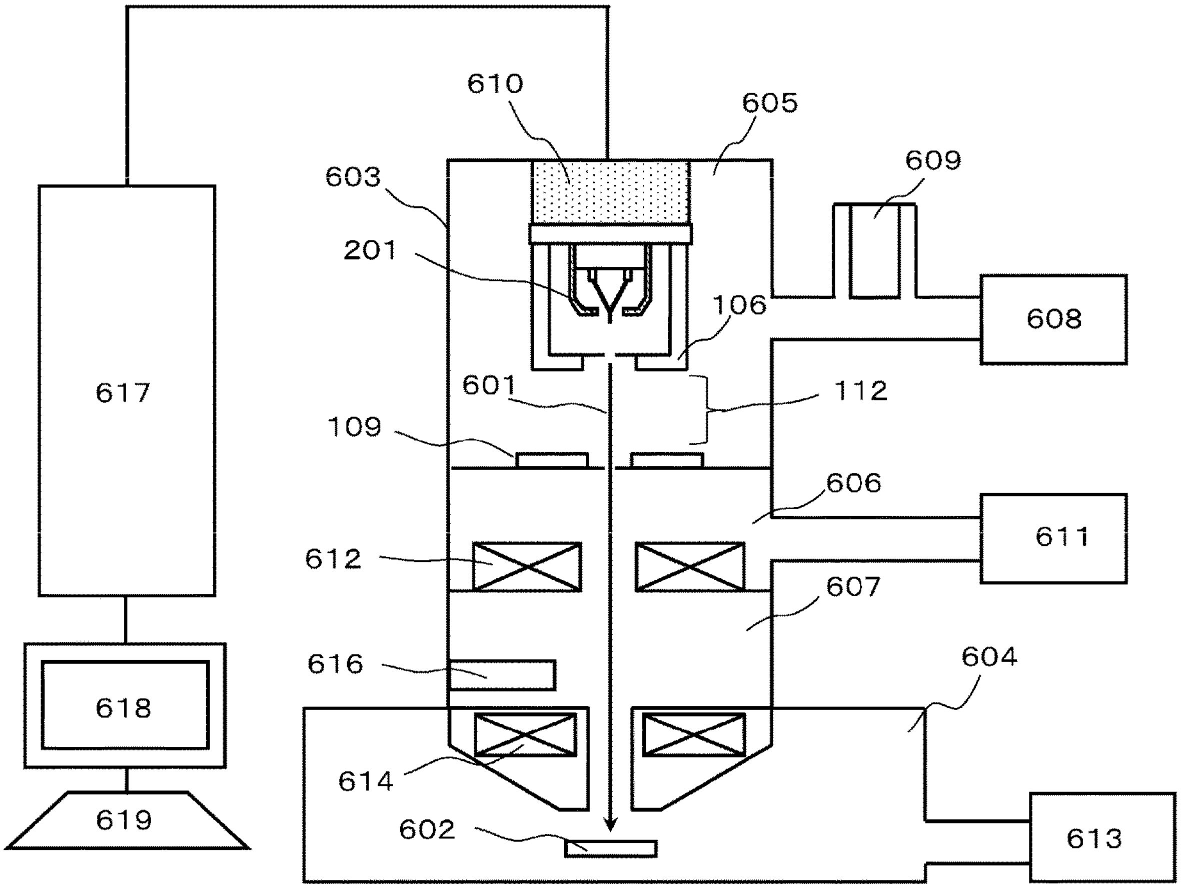

[FIG. 2]
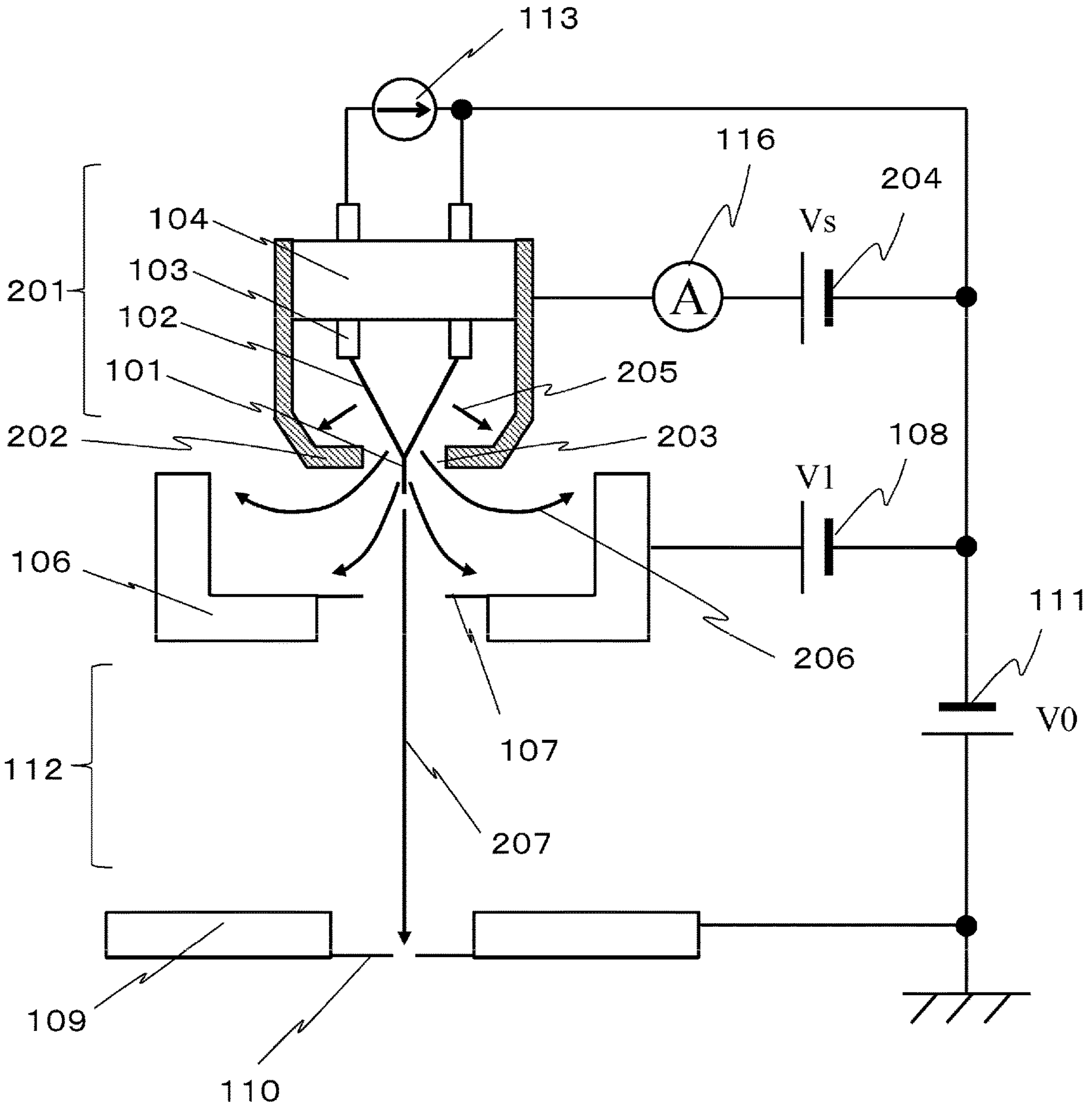

[FIG. 3]
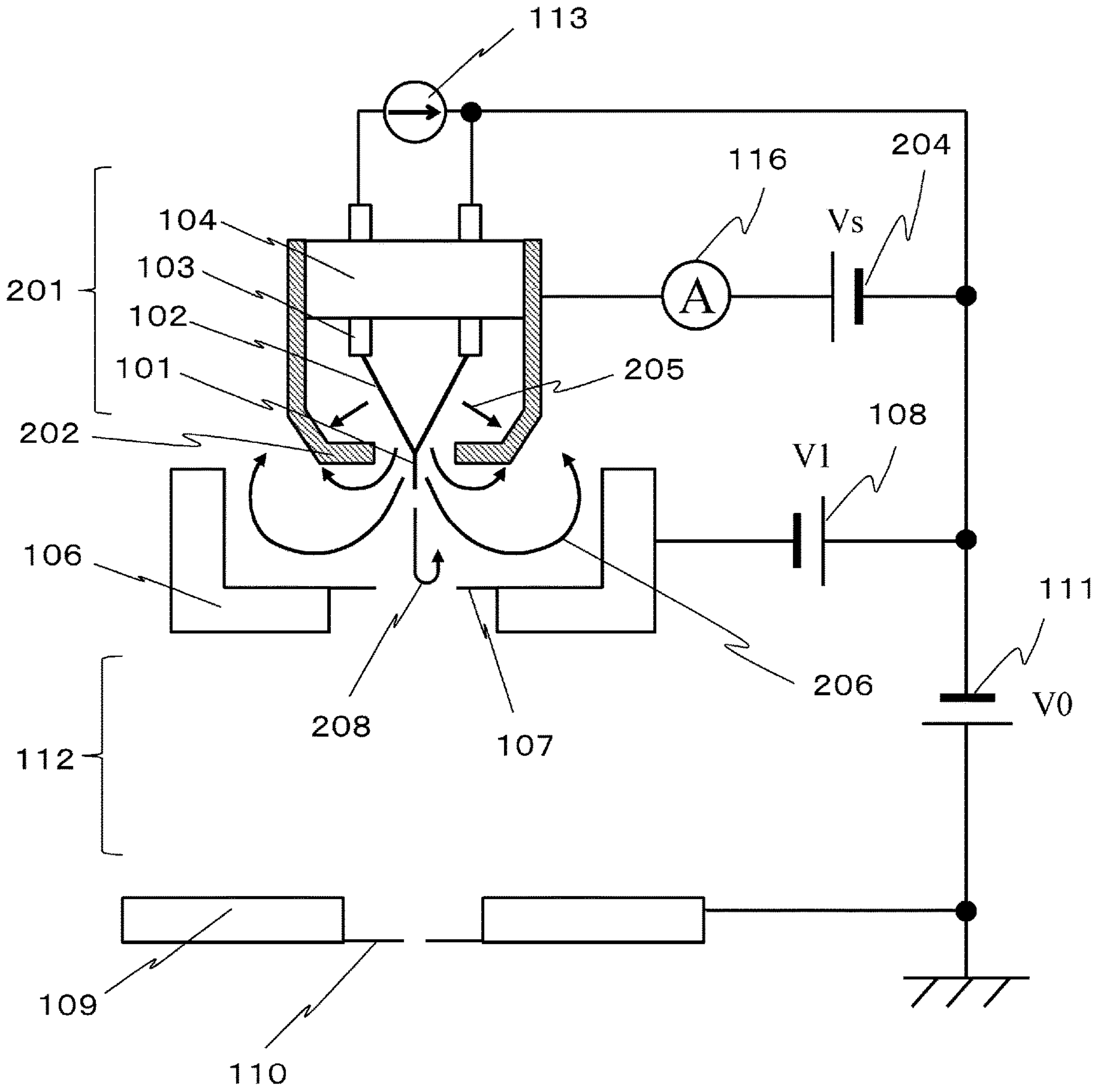

[FIG. 4A]
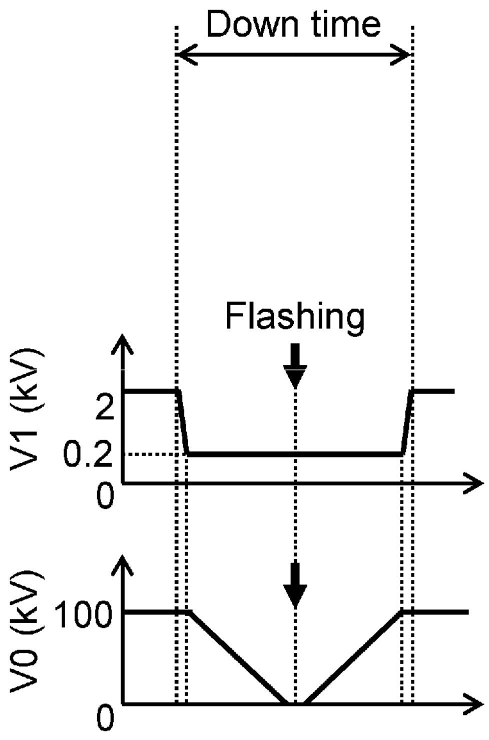

[FIG. 4B]
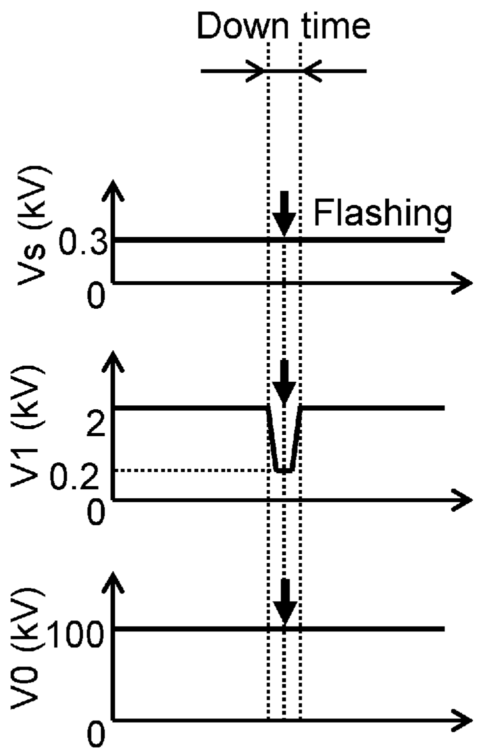
[FIG. 4C]
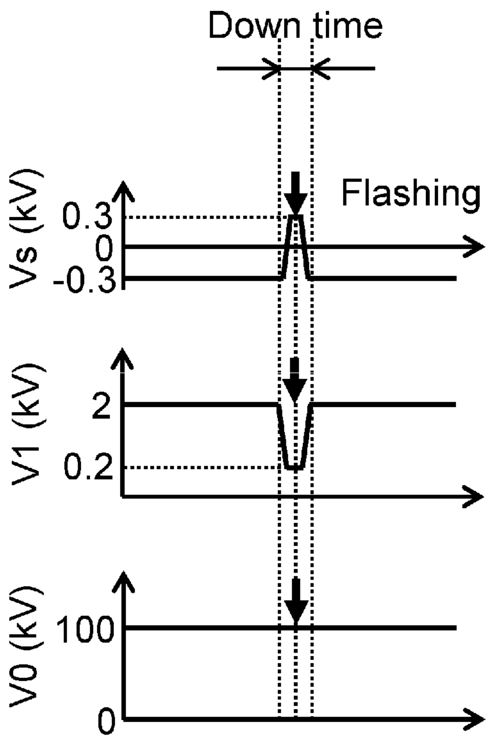

[FIG. 4D]
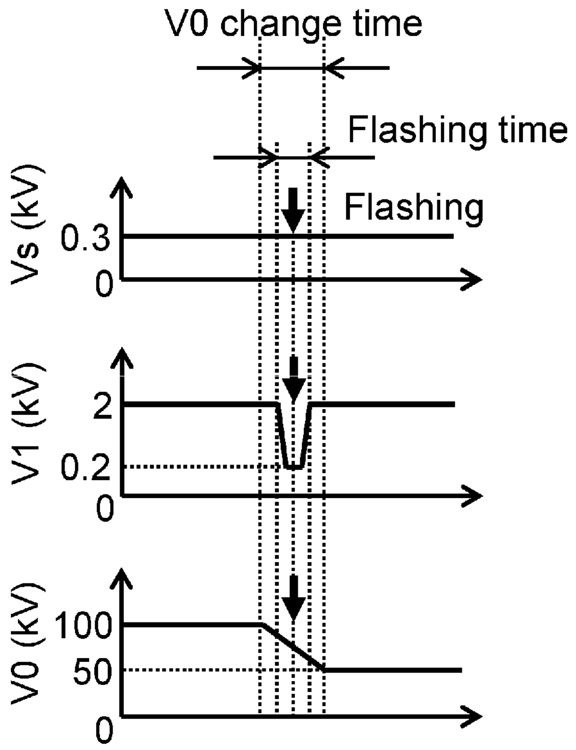
[FIG. 5A]
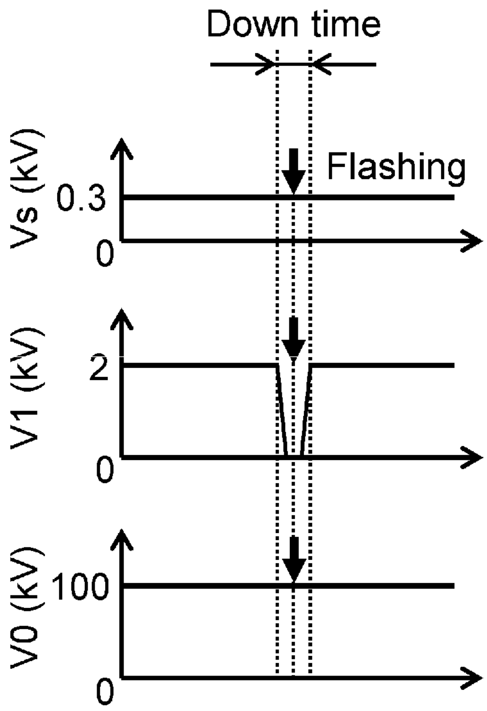

[FIG. 5B]
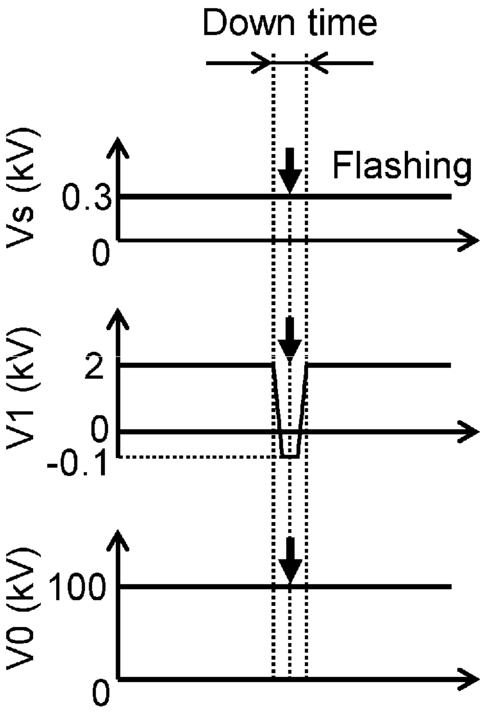

[FIG. 6]
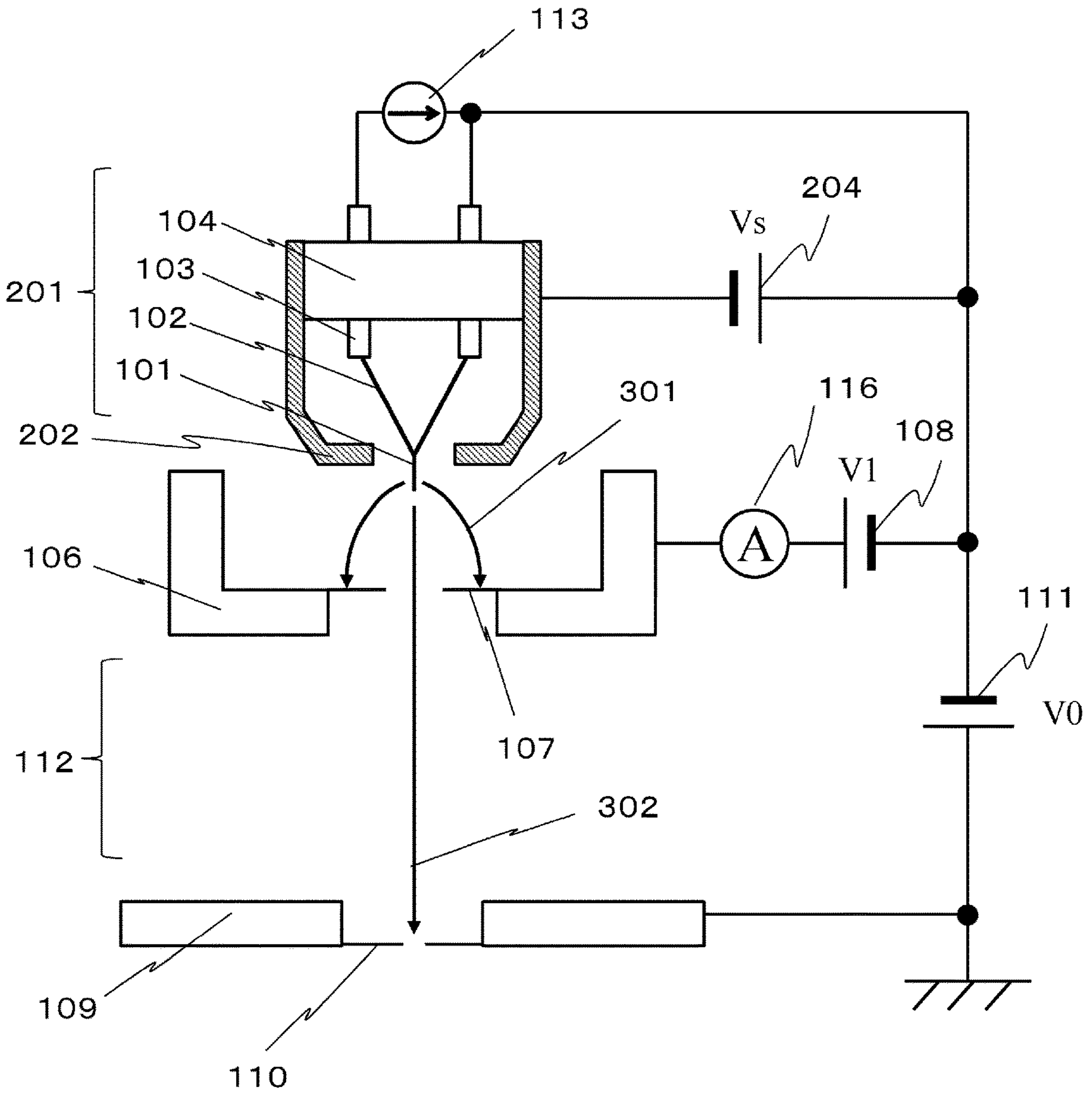

[FIG. 7]
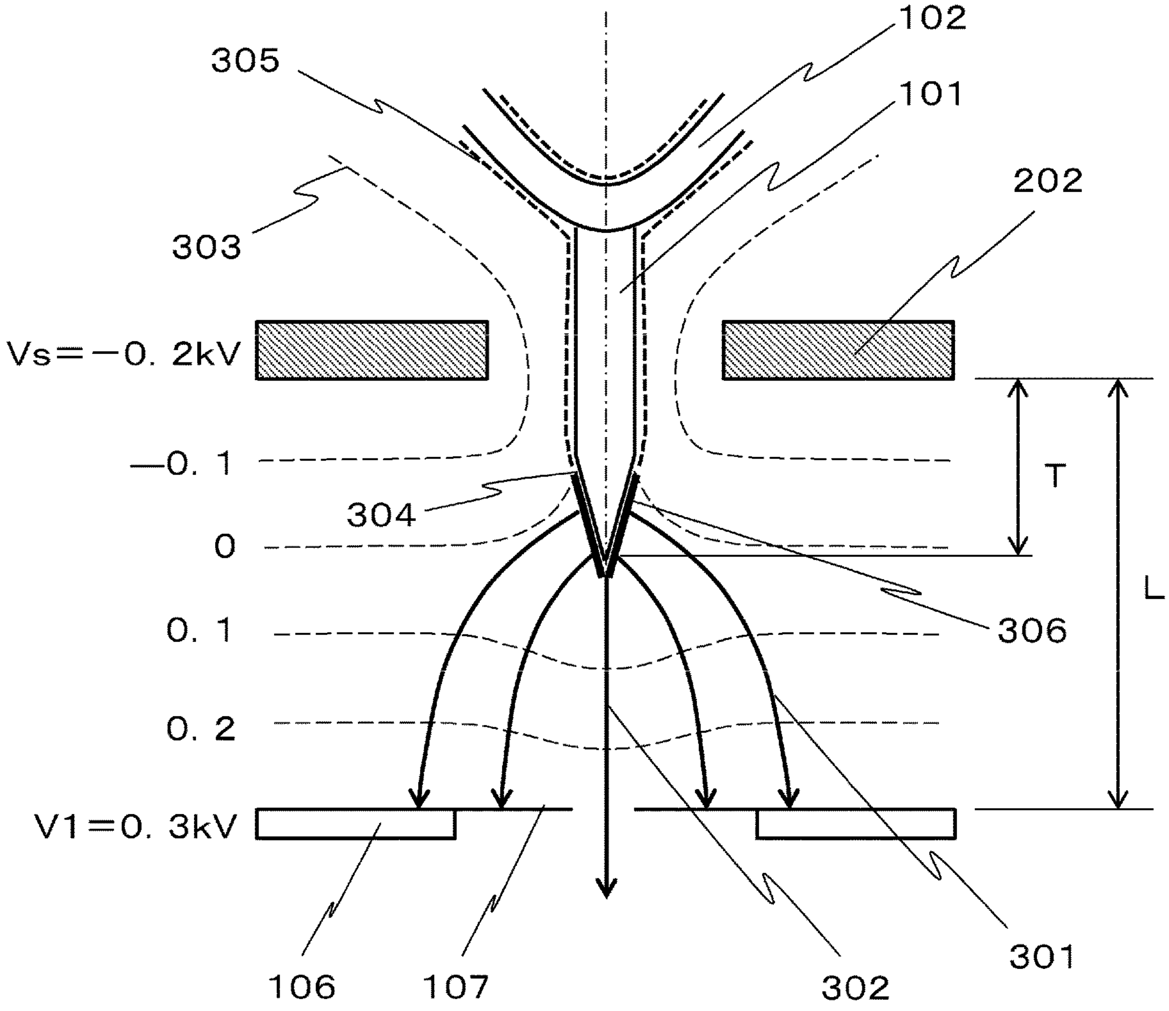

[FIG. 8]
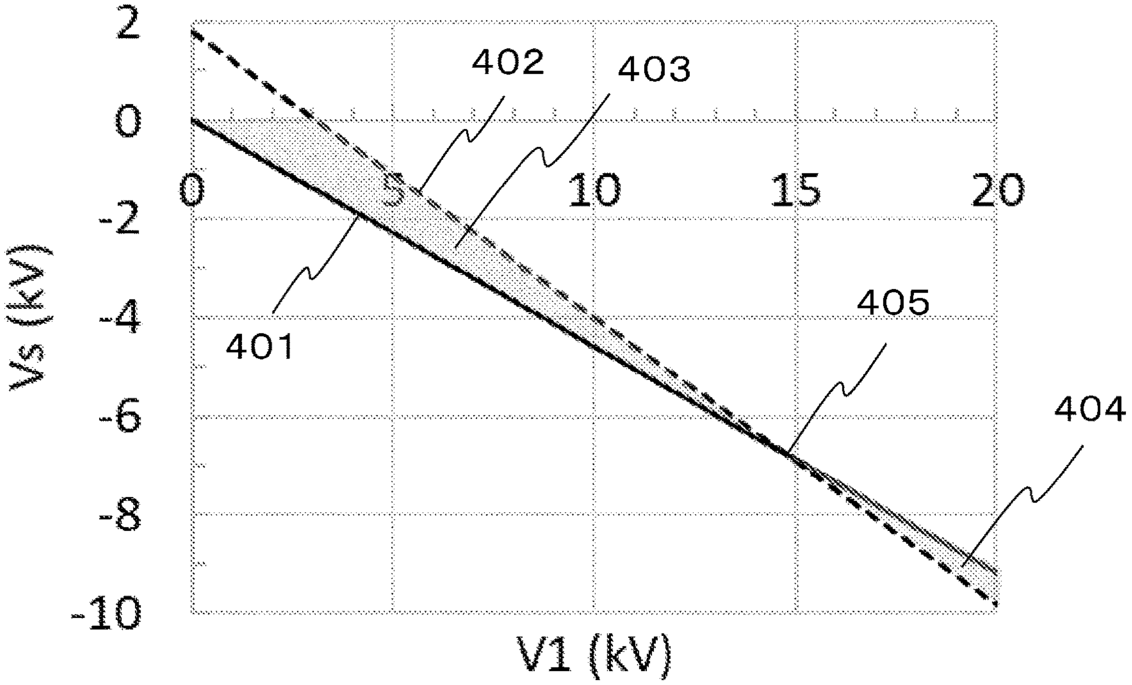

[FIG. 9]
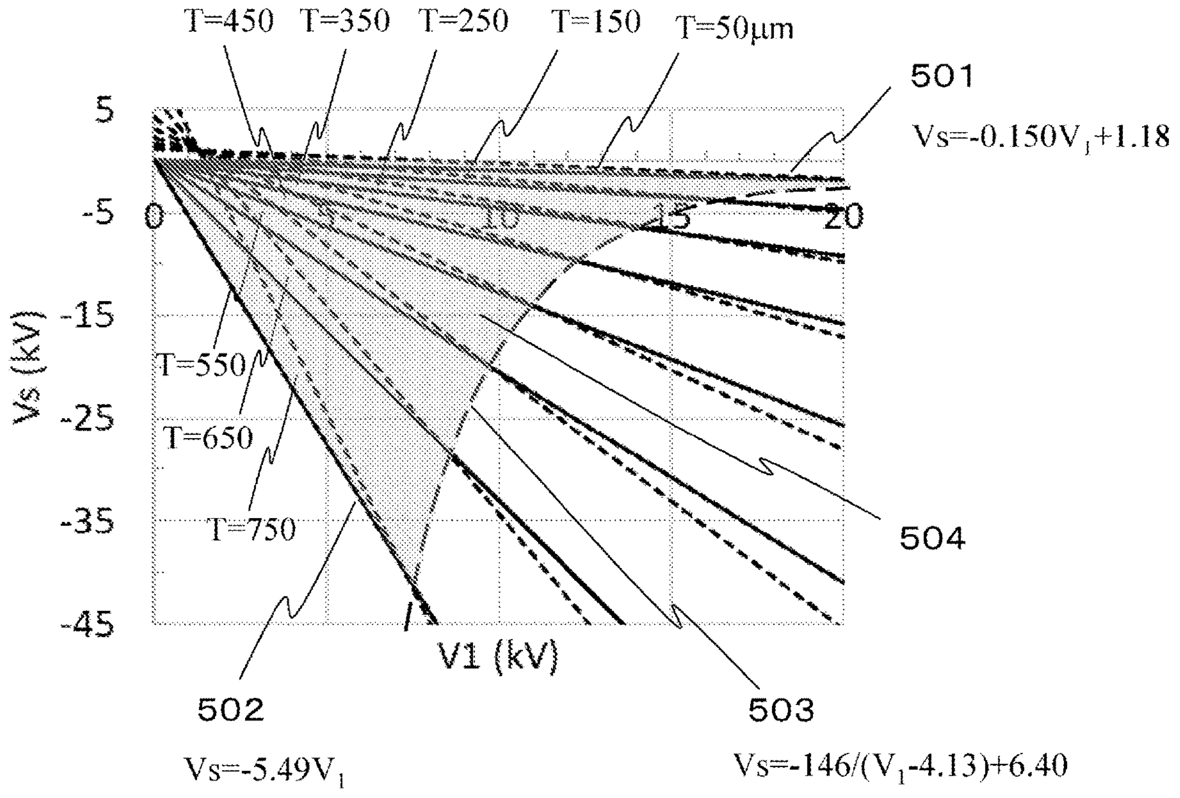
L=800um

[FIG. 10A]
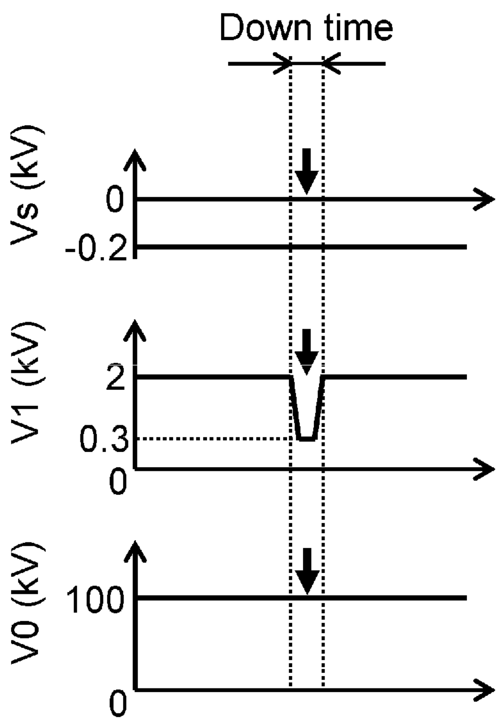
[FIG. 10B]
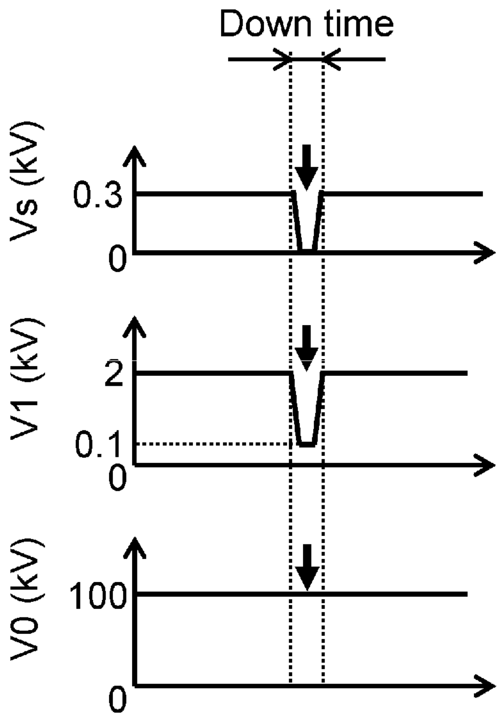

[FIG. 10C]
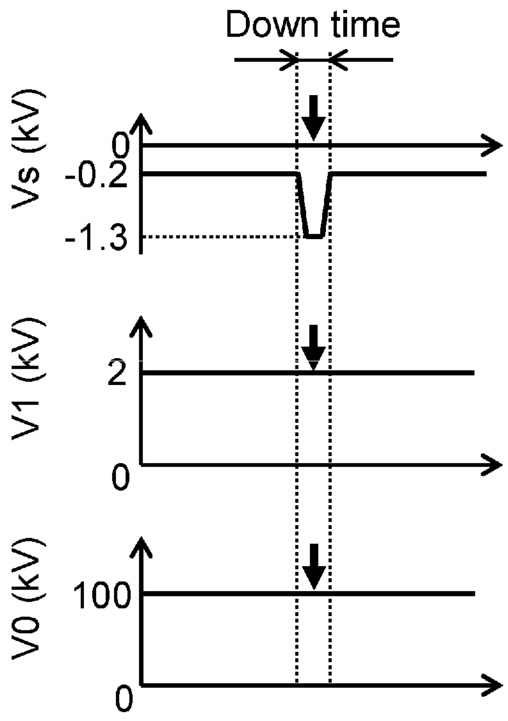
[FIG. 10D]
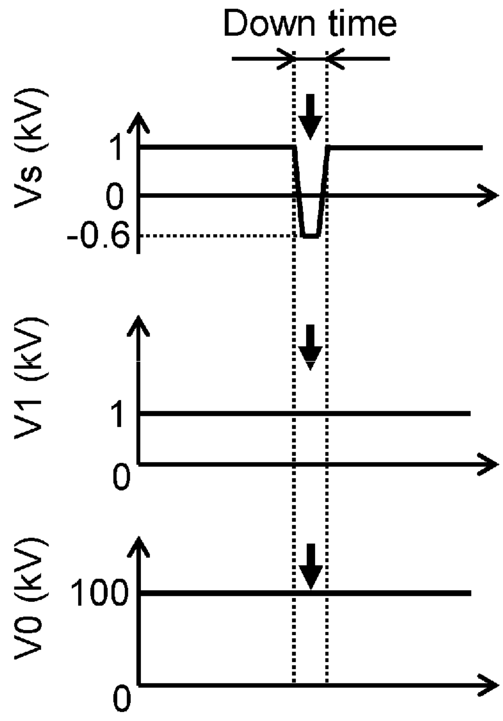

CHARGED PARTICLE BEAM DEVICE

TECHNICAL FIELD

The present invention relates to a charged particle beam device.

BACKGROUND ART

A charged particle beam device is a device that irradiates a sample with a charged particle beam such as an electron beam, detects secondary electrons, transmitted electrons, back scattered electrons, X-rays, and the like emitted from the sample, and generates an observation image of the sample. In order to obtain an observation image with a high spatial resolution, an electron source with high brightness is required, and for example, a cold field emission (CFE) electron source is used. In the cold field emitter that emits an electron beam by concentrating a field on a sharpened distal end of a single crystal (tip), an emission current becomes unstable because a residual gas adheres to the distal end of the tip. Therefore, a cleaning treatment of the distal end of the tip is performed by periodically applying a heating pulse.

When a heating pulse is applied, thermionic electrons may be emitted from the tip and other portions of the cold field emitter. The thermionic electron emission may greatly damage the parts of the charged particle beam device. PTL 1 discloses that, when a field and a heating pulse are applied to a cold field emitter to perform a cleaning treatment, a negative voltage is applied to a cup-shaped suppression electrode covering a portion other than the distal end of the tip to prevent undesirable thermionic electron emission from the tip and other portions.

CITATION LIST

Patent Literature

PTL 1: JP2007-73521A

SUMMARY OF INVENTION

Technical Problem

However, in PTL 1, it is insufficient to consider temperature management of the cold field emitter to which the heating pulse is applied. The temperature of the cold field emitter is estimated from the amount of emitted thermionic electrons. However, when the thermionic electron emission from the tip and other portions is prevented, the temperature cannot be accurately estimated, and it is less likely to precisely manage the temperature.

Accordingly, an object of the invention is to provide a charged particle beam device that can precisely manage a temperature at which a cold field emitter is heated.

Solution to Problem

In order to achieve the above object, the invention provides a charged particle beam device that can precisely manage a temperature at which a cold field emitter is heated. The charged particle beam device includes: a cold field emitter including a tip having a sharpened distal end, a filament connected to the tip, and an auxiliary electrode covering the filament and having an opening from which the tip protrudes; an extraction electrode to which an extraction voltage for extracting electrons from the cold field emitter is applied; and an acceleration electrode to which an acceleration voltage for accelerating the electrons extracted from the cold field emitter is applied. When the tip and the filament are heated, thermionic electrons emitted from the tip and the filament are collected in the auxiliary electrode to measure a current by applying a positive voltage with respect to the tip to the auxiliary electrode.

Advantageous Effects of Invention

The invention can provide a charged particle beam device that can precisely manage a temperature at which a cold field emitter is heated.

BRIEF DESCRIPTION OF DRAWINGS

FIG. 1 is a schematic cross-sectional view showing an example of an overall configuration of a scanning electron microscope that is an example of a charged particle beam device.

FIG. 2 is a schematic cross-sectional view showing an example of a configuration of a cold field emitter and a periphery thereof according to Embodiment 1.

FIG. 3 is a schematic cross-sectional view showing an example of a configuration of a cold field emitter and a periphery thereof according to Embodiment 2.

FIG. 4A is a diagram showing an example of a change in voltage applied to each electrode.

FIG. 4B is a diagram showing an example of a change in voltage applied to each electrode.

FIG. 4C is a diagram showing an example of a change in voltage applied to each electrode.

FIG. 4D is a diagram showing an example of a change in voltage applied to each electrode.

FIG. 5A is a diagram showing an example of a change in voltage applied to each electrode.

FIG. 5B is a diagram showing an example of a change in voltage applied to each electrode.

FIG. 6 is a schematic cross-sectional view showing an example of a configuration of a cold field emitter and a periphery thereof according to Embodiment 5.

FIG. 7 is a schematic cross-sectional view showing an example of a potential distribution in a vicinity of a tip according to Embodiment 5.

FIG. 8 is a diagram showing an example of an optimum voltage range applied to an auxiliary electrode and an extraction electrode.

FIG. 9 is a diagram showing an example of an optimum voltage range applied to the auxiliary electrode and the extraction electrode when a protrusion length T of a tip is changed.

FIG. 10A is a diagram showing an example of a change in voltage applied to each electrode.

FIG. 10B is a diagram showing an example of a change in voltage applied to each electrode.

FIG. 10C is a diagram showing an example of a change in voltage applied to each electrode.

FIG. 10D is a diagram showing an example of a change in voltage applied to each electrode.

DESCRIPTION OF EMBODIMENTS

Hereinafter, embodiments of a charged particle beam device according to the invention will be described with reference to the accompanying drawings. The charged particle beam device is a device that irradiates a sample with a charged particle beam such as an electron beam, detects secondary electrons, transmitted electrons, back scattered electrons, X-rays, and the like emitted from the sample, and generates an observation image of the sample.

Embodiment 1

An overall configuration of a scanning electron microscope that is an example of a charged particle beam device will be described with reference to FIG. 1. The scanning electron microscope is a device for irradiating a sample 602 with an electron beam 601, detecting secondary electrons and back scattered electrons emitted from the sample, and generating an observation image of the sample 602, and includes a tubular body 603 and a sample chamber 604. An inside of the tubular body 603 is divided into a first vacuum chamber 605, a second vacuum chamber 606, and a third vacuum chamber 607 from the top to the bottom. Each vacuum chamber has, at a center, an opening through which the electron beam 601 passes, and is differentially pumped. Hereinafter, each vacuum chamber and the sample chamber 604 will be described.

The first vacuum chamber 605 is vacuum-pumped by an ion pump 608 and a non-evaporable getter pump 609, and a pressure is set to an ultra-high vacuum of $10^{-8}$ Pa, and more preferably set to an extreme-high vacuum of $10^{-9}$ Pa or less. A cold field emitter 201, an extraction electrode 106, and an acceleration electrode 109 are disposed inside the first vacuum chamber 605. The cold field emitter 201 is an electron source for emitting electrons using field concentration, and is held by an insulator 610 and electrically insulated from the tubular body 603. The extraction electrode 106 is an electrode to which an extraction voltage for extracting electrons from the cold field emitter 201 is applied, has a cup shape including the cold field emitter 201, and is provided with an opening through which the electron beam 601 passes on a central axis thereof. The acceleration electrode 109 is an electrode to which an acceleration voltage is applied, and is provided with an opening through which the electron beam 601 passes on a central axis thereof. When the acceleration voltage is applied to the acceleration electrode 109, a field for accelerating the electron beam 601 is formed in an acceleration space 112. A configuration of the cold field emitter 201 and a periphery thereof will be described below with reference to FIG. 2.

The second vacuum chamber 606 is vacuum-pumped by an ion pump 611. Condenser lenses 612 are disposed in the second vacuum chamber 606. The condenser lenses 612 focus the electron beam 601.

A detector 616 is disposed in the third vacuum chamber 607. The detector 616 detects secondary electrons and back scattered electrons emitted from the sample 602. A plurality of detectors 616 may be provided, and may be disposed in the sample chamber 604, the first vacuum chamber 605, or the second vacuum chamber 606.

The sample chamber 604 is vacuum-pumped by a turbomolecular pump 613. Objective lenses 614 and the sample 602 are disposed in the sample chamber 604.

The cold field emitter 201, the extraction electrode 106, the acceleration electrode 109, the condenser lenses 612, the objective lenses 614, and the detector 616 provided in the tubular body 603 and the sample chamber 604, the ion pump 608, the turbomolecular pump 613, and the like are connected to a control unit 617. The control unit 617 is a device for controlling an operation of each unit and generating an observation image of the sample 602 based on a signal detected by the detector 616, and is, for example, a computer, an electronic board, and an electrical circuit. The control of the operation of each unit includes adjustment of a voltage or a current applied to each unit, reception of a value of a voltage or a current measured in each unit, and the like.

A display unit 618 and an input unit 619 are connected to the control unit 617. The display unit 618 is a device for displaying an observation image, and is, for example, a liquid crystal display or a touch panel. The display unit 618 may display a feature calculated from the observation image, a value of a voltage and a current applied to each unit, a value of a voltage and a current measured in each unit, and the like. The input unit 619 is a device used for inputting observation conditions and operation conditions, and is, for example, a keyboard, a mouse, or a touch panel.

An amount of the voltage or current applied to each component, an operating state of the device, and the like are recorded in the control unit 617 and displayed on the display unit 618 or a display unit of an information terminal such as a computer at a remote location at any timing, so that a user or a maintenance person can refer to the information.

For example, values such as an extraction voltage V1, an acceleration voltage V0, an auxiliary voltage Vs, and an emission current amount of the cold field emitter 201 in a steady image observation state are displayed on the display unit 618. When the emission current amount of the cold field emitter 201 is reduced to a preset value or when a predetermined time has elapsed from flashing, the display unit 618 displays that the flashing is necessary. The user or the maintenance person sees this display and performs flashing manually. The flashing may be performed automatically, or may be performed at another timing, for example, during a change in an acceleration voltage, a movement of an observation site on a sample, the exchange of observation samples, the adjustment of focal position, the adjustment of a current under various voltages, or a change in an emission current amount of an electron source.

The voltage and current applied to each unit during the flashing may be displayed on the display unit 618. For example, the acceleration voltage V0, the extraction voltage V1, and the auxiliary voltage Vs during the flashing may be displayed. Further, a current to be measured in the auxiliary electrode 202 or the extraction electrode 106 shown in FIG. 2, a temperature calculated from the measured current, a current supplied from a flashing power supply 113 shown in FIG. 2 to a filament 102, a time during which the current is supplied to the filament 102, and the like may be displayed. From these results, it may be determined whether the device performs flashing in a state where V0 is applied. The user or the maintenance person may optimize the next and subsequent flashing operations by referring to the flashing conditions and adjusting the conditions via the input unit 619.

In addition, the information during the flashing may not be displayed on the display unit 618, but may be recorded in a power supply, the control unit 617, or the like. The user or the maintenance person may refer to the information at any timing. When a plurality of scanning electron microscopes are operated in parallel in a factory or the like, the operation conditions of the plurality of devices are optimized by referring to records of flashing conditions and operating states of the plurality of devices, appropriately obtaining optimum conditions, and feeding back the optimum conditions to all the devices. As a result, reproducibility of an observation image of the entire device is improved, and downtime can be reduced.

An example of the configuration of the cold field emitter 201 and the periphery thereof will be described with reference to FIG. 2. The cold field emitter 201 includes a tip 101, the filament 102, pins 103, an insulator 104, and the auxiliary electrode 202. The tip 101 is made of a metal having a sharpened distal end, for example, a tungsten single crystal having a <310> orientation or a <111> orientation, and has a curvature radius of about 100 nm. The tip 101 is welded to a distal end of the filament 102. The filament 102 is a tungsten polycrystalline wire having a V-shaped hairpin shape. The pins 103 are respectively welded to both ends of the filament 102. The two pins 103 are metal terminals, and are electrically insulated from each other by being held by the insulator 104. The tip 101, the filament 102, and the pins 103 are electrically at the same potential.

An extraction power supply 108 is connected between the pins 103 and the extraction electrode 106. The extraction power supply 108 applies the extraction voltage V1, which is a positive voltage with respect to the tip 101, to the extraction electrode 106. The extraction voltage V1 is, for example, about 2 kV to 4 kV. When a field is concentrated on the distal end of the tip 101 by applying the extraction voltage V1, and the intensity of the field is $3\times10^9$ V/m or more, tunnel electrons are field-emitted from the distal end of the tip 101. The tunnel electrons pass through an opening of an aperture 107 that is disposed on the central axis of the extraction electrode 106 and has the same potential as the extraction electrode 106.

An acceleration power supply 111 is connected between the acceleration electrode 109 and the tip 101. The acceleration power supply 111 applies the acceleration voltage V0, which is a positive voltage with respect to the tip 101, to the acceleration electrode 109. The acceleration voltage V0 is, for example, about 5 kV to 300 kV. That is, when the acceleration electrode 109 is at the ground potential, a voltage of about −5 kV to −300 kV is applied to the tip 101. By applying the extraction voltage V1 and the acceleration voltage V0, a field due to a voltage difference of V0−V1 is formed in the acceleration space 112 between the extraction electrode 106 and the acceleration electrode 109, and the electron beam passing through the acceleration space 112 is accelerated to the acceleration voltage V0. The field formed in the acceleration space 112 functions as an electrostatic lens to focus the electron beam. The electron beam accelerated by the acceleration space 112 passes through an opening of an aperture 110 disposed on the central axis of the acceleration electrode 109 and having the same potential as the acceleration electrode 109, and is radiated onto the sample 602.

The emission current from the distal end of the tip 101 is reduced when a hydrogen gas or an organic gas adheres to an electron emission surface of the distal end of the tip 101 as a residual gas. Therefore, a cleaning treatment called flashing in which the filament 102 and the tip 101 are heated by supplying a pulse current from the flashing power supply 113 connected between the pins 103 is periodically performed. That is, the residual gas at the distal end of the tip 101 is desorbed by the flashing, and the reduced emission current is returned to an initial value. The timing at which the flashing is performed may be determined based on an instruction from an operator, or may be automatically determined based on a reduction in the emission current from the distal end of the tip 101. The supply time of the pulse current is several seconds or shorter, and more preferably 1 second or shorter.

The organic gas such as CO and $CO_2$ strongly adhering to the tip 101 starts to be desorbed by heating at 1600° C. or higher and is completely desorbed by heating at 1900° C. or higher. The hydrogen gas, which is a main component of the residual gas, is desorbed by heating up to 1500° C. When the cleaning is insufficient, the reproducibility of the current of the electron beam cannot be obtained, and the reproducibility of the observation image cannot be obtained. In contrast, the distal end of the tip 101 starts to be blunted (increase in curvature radius) by heating at 2200° C. or higher, and rapidly proceeds to be blunted by heating at 2400° C. or higher. When the distal end of the tip 101 is blunted, the intensity of the field at the distal end of the tip 101 decreases, and emitted tunnel electrons are reduced. Therefore, in order to obtain a predetermined current, it is necessary to increase the extraction voltage. When the tip 101 proceeds to be blunted and the voltage required for field emission exceeds the specification of the extraction power supply, the electron source reaches the end of life and is required to be replaced. From the above, the temperature during the flashing is preferably 1600° C. to 2400° C., and more preferably 1900° C. to 2200° C. That is, it is important to achieve both cleaning of the tip and long life by precisely managing the temperature at which the tip 101 and the filament 102 are heated by the flashing. The temperature during the flashing is optimized by feeding back the measurement result of the temperature to the flashing condition.

The heating at 1600° C. or higher causes the filament 102 and the tip 101 to emit thermionic electrons 205, 206, and 207. These thermionic electrons increase in an exponential manner with respect to the temperature during the flashing, and may damage each unit. Therefore, the auxiliary electrode 202 is provided as an electrode that covers the filament 102.

The auxiliary electrode 202 is held by the insulator 104 and is electrically insulated from the pin 103. The auxiliary electrode 202 has a cup shape and has an opening 203 from which the distal end of the tip 101 protrudes. A size of the opening 203 is made as small as possible in order to prevent the leakage of thermionic electrons to the outside of the auxiliary electrode 202, and for example, the diameter is 1 mm or less, and more preferably 0.6 mm or less.

A distance L between the auxiliary electrode 202 and the extraction electrode 106 is typically about 400 μm to 800 μm, and more preferably about 500 μm to 600 μm. A protrusion length T, which is a length of the distal end of the tip 101 protruding from the opening 203 of the auxiliary electrode 202, is typically about 50 μm to 750 μm, and more preferably about 50 μm to 350 μm. A diameter of the opening of the aperture 107 of the extraction electrode 106 is typically 1 mm or less, and more preferably 0.5 mm or less in order to reduce the thermionic electrons entering the acceleration space 112.

An auxiliary power supply 204 and an ammeter 116 are connected between the auxiliary electrode 202 and the pins 103. The auxiliary power supply 204 applies the auxiliary voltage Vs that is a voltage for the tip 101. The auxiliary voltage Vs is set to any one of a positive voltage, a negative voltage, and a voltage of 0 depending on the situation. For example, a positive voltage is set as the auxiliary voltage Vs during the flashing, and the auxiliary voltage Vs is typically set to 0.1 kV to 1 kV, and more preferably 0.1 kV to 0.6 kV.

When a positive voltage is set as the auxiliary voltage Vs, the thermionic electrons 205 emitted from a root side of the filament 102 among the thermionic electrons 205, 206, and 207 are incident on the auxiliary electrode 202 and are measured by the ammeter 116. A value measured by the ammeter 116 is transmitted to the control unit 617, and is converted into a temperature by using, for example, the Richardson-Dushman equation. The value measured by the ammeter 116 may be converted into the temperature using a table created by measuring a relationship between the heating temperature of the tip 101 and the filament 102 and the amount of thermionic electrons in advance. That is, most of the thermionic electrons emitted from the filament 102 are measured by the ammeter 116, and the temperature is calculated. Therefore, the temperature at which the cold field emitter is heated can be precisely managed.

The auxiliary voltage Vs is preferably higher than the extraction voltage V1. When the extraction voltage V1 is smaller than the auxiliary voltage Vs, the thermionic electrons receive a repulsive force from the extraction electrode due to a potential gradient between the auxiliary electrode 202 and the extraction electrode 106. As a result, the thermionic electrons 206 returning to the auxiliary electrode 202 among the thermionic electrons 206 and 207 passing through the opening 203 of the auxiliary electrode 202 increase. That is, more of the thermionic electrons emitted from the tip 101 and the filament 102 are measured by the ammeter 116, so that the heating temperature of the tip 101 and the filament 102 is more accurately determined. When the extraction voltage V1 is smaller than the auxiliary voltage Vs, a trajectory of the thermionic electrons is bent by the repulsive force, and the thermionic electrons 207 passing through the opening of the aperture 107 are reduced. As a result, the thermionic electrons 207 entering the acceleration space 112 can be reduced. The effect of reducing the thermionic electrons 207 entering the acceleration space 112 will be described below in Embodiment 3. The field at the distal end of the tip 101 formed by the auxiliary voltage Vs and the extraction voltage V1 during the flashing is sufficiently low, and is $3\times10^9$ V/m or less. Therefore, problems such as buildup described below and mixing of thermionic electrons into tunnel electrons do not occur.

As described above, in Embodiment 1, by applying a positive voltage with respect to the tip 101 to the auxiliary electrode 202 that covers the filament 102 and has the opening 203 from which the tip 101 protrudes, the thermionic electrons emitted during the flashing are collected by the auxiliary electrode 202. The temperature of the tip 101 and the filament 102 is calculated based on the current measured in the auxiliary electrode 202, so that the temperature during the flashing can be accurately managed. The residual gas can be appropriately desorbed without blunting the distal end of the tip 101 by precisely controlling the temperature during the flashing. As a result, an observation image with good reproducibility can be obtained while maintaining the current of the predetermined electron beam, and the life of the cold field emitter can be extended.

The flashing temperature can also be managed by connecting the ammeter 116 to the extraction power supply 108 instead of the auxiliary power supply 204. In this case, most of the thermionic electrons collide with the auxiliary electrode, and thus the amount of current measured in the extraction electrode is reduced. On the other hand, the thermionic electrons may be measured by causing the inside of the extraction power supply 108 to have dual system power supply capacities in a general cold field emitter having no auxiliary electrode and switching to a circuit having a high capacity during the flashing. However, the extraction power supply 108 has dual system power supply capacities, and thus, there is a problem that the cost increases. When the cold field emitter is provided with the auxiliary electrode according to Embodiment 1, it is not required to provide dual system power supply capacities for the extraction power supply, and the cost can be reduced.

In addition, since the auxiliary electrode 202 is located behind the distal end of the tip and the tunnel electrons are not radiated, the power supply capacity of the auxiliary power supply 204 may be set based on the amount of current of the thermionic electrons emitted during the flashing. Therefore, the auxiliary power supply 204 is not required to have dual system power supply capacities like the extraction power supply according to the related art, and the cost can be reduced. The flashing temperature can also be managed by connecting the ammeter 116 to the flashing power supply 113 and measuring the total amount of the current of the thermionic electrons.

Embodiment 2

Embodiment 1 describes that the auxiliary voltage Vs and the extraction voltage V1 during the flashing are set to positive voltages. Embodiment 2 describes that the auxiliary voltage Vs during the flashing is set to a positive voltage, and the extraction voltage V1 is set to zero or a negative voltage. In Embodiment 2, a part of configurations and functions described in Embodiment 1 can be applied, and thus the same configurations and functions are denoted by the same reference numerals and description thereof will be omitted.

An example of a configuration of the cold field emitter 201 and the periphery thereof will be described with reference to FIG. 3. The configuration of the cold field emitter 201 and the periphery thereof is the same as that of Embodiment 1. However, the extraction voltage V1 applied to the extraction electrode 106 by the extraction power supply 108 is zero or a negative voltage.

Since the extraction voltage V1 is zero or a negative voltage, the potential gradient between the auxiliary electrode 202 and the extraction electrode 106 is larger than that in Embodiment 1, and the repulsive force is stronger. As a result, the thermionic electrons 206 passing through the opening 203 and returning to the auxiliary electrode 202 increase. Further, the thermionic electrons 207 (referred to as thermionic electrons 208 in FIG. 3) having passed through the opening of the aperture 107 in Embodiment 1 cannot exceed the potential gradient and cannot pass through the opening, and return to the auxiliary electrode 202. That is, all the thermionic electrons emitted from the tip 101 and the filament 102 are measured by the ammeter 116, so that the heating temperature of the tip 101 and the filament 102 is more accurately determined. As a result, improvement in reproducibility of an observation image and extension of the lifetime of an electron source can also be achieved in Embodiment 2.

Further, the thermionic electrons 207 having passed through the opening of the aperture 107 disappear, and thus the number of the thermionic electrons becomes zero, and the thermionic electrons do not enter the acceleration space 112. The effect of eliminating the thermionic electrons 207 entering the acceleration space 112 will be described below in Embodiment 4.

As described above, in Embodiment 2, a positive voltage with respect to the tip 101 is applied to the auxiliary electrode 202, and a voltage that is zero or a negative voltage is applied to the extraction electrode 106, so that more of the thermionic electrons emitted during the flashing are collected by the auxiliary electrode 202. The temperature of the tip 101 and the filament 102 is calculated based on the current measured in the auxiliary electrode 202, so that the temperature during the flashing can be more precisely managed. The residual gas can be appropriately desorbed without blunting the distal end of the tip 101, and thus the reproducibility of the observation image can be improved and the life of the cold field emitter can be extended.

Embodiment 3

Embodiments 1 and 2 have described that thermionic electrons are collected to perform a measurement in the auxiliary electrode 202 by applying a positive voltage to the auxiliary electrode 202 during the flashing. In Embodiment 3, the temperature is precisely controlled by collecting thermionic electrons by setting the auxiliary voltage Vs and the extraction voltage V1 during the flashing to positive voltages, and the downtime of the device is reduced by performing flashing while applying the acceleration voltage V0 during the flashing. In Embodiment 3, a part of the configurations and functions described in Embodiments 1 and 2 can be applied, and thus the same configurations and functions are denoted by the same reference numerals and description thereof will be omitted.

During image observation in a steady state, the cold field emitter emits tunnel electrons of several μA to several hundred μA from an electron emission surface at the distal end of the tip. On the other hand, during the flashing, thermionic electrons of several mA to several hundred mA are temporarily emitted from the tip and the filament. That is, the amount of current produced by the thermionic electrons is about 1000 times larger than the amount of current produced by the tunnel electrons. The power supply capacity of the acceleration power supply 111 is created based on the amount of current produced by the tunnel electrons in the steady state. Therefore, when the flashing is performed while the acceleration voltage is applied, an excessive current flows to the acceleration power supply and the power supply capacity is insufficient. As a result, the acceleration voltage may change sharply to cause discharging, and the power supply may fail. In addition, when a large amount of thermionic electrons accelerated to high energy collide with the acceleration electrode, an electron impact desorption gas and ions are generated. In this case, the vacuum of an electron gun deteriorates, and the electron source may be damaged because the thermionic electrons collide with the electron source. In order to avoid the cause of failure of these devices, a charged particle beam device equipped with a general cold field emitter having no auxiliary electrode stops image observation once, stops application of an acceleration voltage, and then performs flashing.

For example, when flashing is performed by a charged particle beam device with an acceleration voltage of 100 kV and a voltage rise rate and a voltage drop rate of 2 kV/sec, first, the acceleration voltage is dropped from 100 kV to 0 V over 50 seconds to stop the application of the acceleration voltage. Next, the flashing is performed for several seconds or shorter, and more preferably 1 second or shorter. Then, the acceleration voltage rises again from 0 V to 100 kV over 50 seconds. When all the steps are added, it is required to stop the image observation for at least 100 seconds in order to perform the flashing. The time during which the image observation is stopped is referred to as downtime. The higher the acceleration voltage of the device is, the longer the time required for the voltage drop and the voltage rise. Therefore, the downtime also becomes longer. The downtime can be reduced by increasing the voltage drop rate and the voltage rise rate. However, when these rates are high, the field sharply changes, and discharging may occur. Therefore, the magnitude of the voltage drop rate and the voltage rise rate is limited. The voltage drop rate and the voltage rise rate are typically 3 kV/sec or shorter, and more preferably 2 kV/sec or shorter.

In a scanning electron microscope or the like used in a production process of a semiconductor device, it is preferable to reduce a production cost and a production time by observing more devices in a shorter time. Therefore, requiring a long downtime for each flashing causes a problem of increasing the production cost and production time of the semiconductor device. In a scanning electron microscope or the like used in a production process of such a semiconductor device, it may be important to measure the dimensions of the device with good reproducibility, and reproducibility of an observation image is important.

The cold field emitter 201 described in Embodiment 1 collects the thermionic electrons during the flashing in the auxiliary electrode to precisely manage the temperature. At this time, since most of the thermionic electrons collide with the auxiliary electrode 202, the amount of current produced by the thermionic electrons 207 entering the acceleration space 112 is about 1/100 of that of a general cold field emitter without the auxiliary electrode 202. The amount of current is about 10 times the amount of current produced by the tunnel electrons in the steady state. Therefore, when the power supply capacity of the acceleration power supply 111 is 10 times that of the related art, the acceleration power supply does not fail even when flashing is performed while applying the acceleration voltage.

As described in Embodiment 1, when the extraction voltage V1 is smaller than the auxiliary voltage Vs, the amount of current produced by the thermionic electrons 207 entering the acceleration space 112 further decreases, and becomes substantially the same as the amount of current produced by the tunnel electrons in the steady state. As a result, even if the power supply capacity of the acceleration power supply 111 is the same as that of the related art, the acceleration power supply does not fail due to the shortage of the power supply capacity even if the flashing is performed while the acceleration voltage is applied. It is not required to increase the power supply capacity, and thus the cost of the power supply can be reduced. In addition, the amount of electron shock desorption gas and ions generated is reduced to the same level as that in the steady state, so that deterioration in the degree of vacuum of the electron gun is prevented and the possibility of breakage of the electron source is also reduced. For the above reasons, flashing can be performed even when the voltage V0 is applied, and the downtime can be reduced by eliminating the time required for the drop and rise of the acceleration voltage V0.

Examples of temporal changes in voltages applied to the electrodes will be described with reference to FIGS. 4A to 4D. An example of a voltage change during flashing of a general cold field emitter according to the related art having no auxiliary electrode will be described with reference to FIG. 4A. Here, the acceleration voltage V0 during tunnel electron emission (during image observation) is 100 kV, the extraction voltage V1 is 2 kV, the voltage drop rate and the voltage rise rate are 2 kV/sec, the extraction voltage V1 during the flashing is 0.2 kV, and the flashing time is 1 second.

When flashing is performed by a general cold field emitter according to the related art having no auxiliary electrode, first, the extraction voltage V1 drops from 2 kV to 0.2 kV to stop field emission and image observation. The required time is 0.9 seconds. Next, the acceleration voltage V0 drops from 100 kV to 0 kV, and the application of the acceleration voltage V0 is stopped. The required time is 50 seconds.

Next, the flashing is performed. The required time is 1 second. Next, the acceleration voltage V0 rises from 0 kV to 100 kV, and the application of V0 is restarted. The required time is 50 seconds. Finally, the extraction voltage V1 rises from 0.2 kV to 2 kV, and field emission and image observation are restarted. The required time is 0.9 seconds. The time required for all the steps is 102.8 seconds, which is the downtime required for each flashing.

FIG. 4B shows an example in which, in the cold field emitter including the auxiliary electrode, the auxiliary voltage Vs is constant at 0.3 kV, the extraction voltage V1 drops from 2 kV during image observation to 0.2 kV during flashing and then rises to 2 kV again, and the acceleration voltage V0 is constant at 100 kV. The time during which the extraction voltage V1 drops from 2 kV to 0.2 kV is 0.9 s. The time during which the extraction voltage V1 is maintained at 0.2 kV during flashing is 1 s. The time during which the extraction voltage V1 rises from 0.2 kV to 2 kV is 0.9s. The time during which the image observation is not performed is limited to 2.8 s. According to the present configuration, the flashing is performed while maintaining the acceleration voltage V0 during field emission (during image observation) before and after the flashing and V0 during the flashing constant, so that the time required for the drop and rise of V0 can be omitted, and downtime can be significantly reduced compared with that of the related art. In the present configuration, since the auxiliary voltage Vs during the field emission (during the image observation) and the auxiliary voltage Vs during the flashing are constant, there is an advantage that the time during which the auxiliary voltage Vs drops and rises can be omitted. During the flashing, the auxiliary voltage Vs is 0.3 kV, the extraction voltage V1 is 0.2 kV, and the extraction voltage V1 is smaller than the auxiliary voltage Vs, and thus the heating temperature of the tip 101 and the filament 102 can be more accurately determined.

FIG. 4C shows an example in which the auxiliary voltage Vs is −0.3 kV during image observation and 0.3 kV during flashing, the extraction voltage V1 is 2 kV during the image observation and 0.2 kV during the flashing, and the acceleration voltage V0 is constant at 100 kV. The time during which the auxiliary voltage Vs and the extraction voltage V1 rise or drop is 0.9 s, the time during which flashing is performed is 1 s, and the time during which image observation is not performed is limited to 2.8 s. With this configuration, the downtime can be significantly reduced compared with that of the related art by performing flashing while applying the acceleration voltage V0. The auxiliary power supply 204 having the present configuration is a power supply capable of outputting both positive and negative polarities. By making the auxiliary power supply 204 have both positive and negative polarities, there is an advantage that flashing can be performed with a precisely controlled temperature regardless of whether Vs during image observation in the steady state is positive or negative. When Vs during electron emission is set to be negative, the extraction voltage required to emit the same amount of current is higher than a case where Vs is set to be positive. When the extraction voltage is high, the influence of the electron interaction is reduced, and thus there is an advantage that an electron beam having high brightness can be obtained. The extraction voltage V1 is smaller than the auxiliary voltage Vs during flashing, and thus the heating temperature of the tip 101 and the filament 102 can be more accurately determined.

FIG. 4D shows an example in which the auxiliary voltage Vs is constant at 0.3 kV, the extraction voltage V1 is 2 kV during image observation and 0.2 kV during flashing, and the acceleration voltage V0 drops from 100 kV during first image observation to 50 kV during second image observation. The time during which the extraction voltage V1 rises or drops is 0.9 s, the time during which flashing is performed is 1 s, and the time during which image observation is not performed is limited to 2.8 s. The extraction voltage V1 is smaller than the auxiliary voltage Vs during flashing, and thus the heating temperature of the tip 101 and the filament 102 can be more accurately determined. Further, the flashing is performed in the period during which the acceleration voltage V0 is changed, and thus it is not necessary to increase an unnecessary downtime. The flashing may be performed not only in a period during which the acceleration voltage V0 is changed, but also in a period during which the movement of an observation site, the replacement of the sample 602, the adjustment of a focal position, the adjustment of a voltage or the current applied to each unit, and the like are performed. Accordingly, an additional downtime does not occur due to the flashing step. The downtime of flashing effectively becomes 0, and thus the downtime in the entire operation of the device is reduced.

As shown in FIG. 4A, in the general cold field emitter according to the related art having no auxiliary electrode, the application of V0 (unit: kV) is stopped to perform flashing. The voltage drop rate or the voltage rise rate is typically 3 kV/sec or shorter in order to avoid discharging, and thus it takes V0/3 second for voltage drop and V0/3 second for voltage rise when flashing is performed. These times are combined, and a downtime of at least V0×2/3 seconds occurs. The voltage drop rate or the voltage rise rate is more preferably 2 kV/sec or shorter, and thus it takes V0/2 second for voltage drop and V0/2 second for voltage rise. These times are combined, and a downtime of at least V0 seconds occurs.

In contrast, in the scanning electron microscope according to Embodiment 3, the flashing is performed while applying V0, and thus it is not required to take time to drop and raise V0. As a result, the downtime required for flashing can be typically V0×2/3 seconds or shorter, and more preferably set to V0 seconds or shorter.

As described above, in Embodiment 3, by applying a positive voltage with respect to the tip 101 to the auxiliary electrode 202 and the extraction electrode 106, flashing can be performed while applying the acceleration voltage V0, with a low risk of occurrence of stop of the device, deterioration of the pressure of the electron gun, and discharging due to insufficient capacity of the acceleration power supply 111. As a result, the downtime required for flashing can be significantly reduced as compared with the related art. The auxiliary electrode 202 is caused to collect more thermionic electrons emitted during flashing and the temperature of the tip 101 and the filament 102 is calculated based on the current measured in the auxiliary electrode 202, and thus the temperature during the flashing can be more precisely managed. The residual gas can be appropriately desorbed without blunting the distal end of the tip 101, and thus the reproducibility of the observation image can be improved and the life of the cold field emitter can be extended.

Embodiment 4

Embodiment 3 describes that the collection of thermionic electrons during flashing is performed by setting the auxiliary voltage Vs and the extraction voltage V1 during flashing to positive voltages, and the downtime of the device is reduced. Embodiment 4 describes that both precise temperature control and reduction of downtime are achieved by setting the auxiliary voltage Vs during flashing to a positive voltage and setting the extraction voltage V1 to zero or a negative voltage. In Embodiment 4, a part of the configurations and functions described in Embodiments 1 to 3 can be applied, and thus the same configurations and functions are denoted by the same reference numerals and description thereof will be omitted.

As described in Embodiment 2, the number of the thermionic electrons entering the acceleration space 112 becomes zero by setting the auxiliary voltage Vs during flashing to a positive voltage and setting the extraction voltage V1 to zero or a negative voltage. As a result, even when the flashing is performed while the acceleration voltage V0 is applied, the downtime can be reduced without causing problems such as failure, deterioration of the pressure of the electron gun, and breakage of the electron source due to insufficient capacity of the acceleration power supply 111.

Examples of changes in voltages applied to the electrodes will be described with reference to FIGS. 5A and 5B. FIG. 5A shows an example in which the auxiliary voltage Vs is constant at 0.3 kV, the extraction voltage V1 drops from 2 kV during image observation to 0 kV during flashing and then rises to 2 kV again, and the acceleration voltage V0 is constant at 100 kV. The time during which the extraction voltage V1 rises or drops is 1 s, the flashing time is 1 s, and the time during which image observation is not performed is limited to 3 s, and thus the downtime can be significantly reduced as compared with that of the related art. During the flashing, the auxiliary voltage Vs is 0.3 kV, the extraction voltage V1 is 0 kV, and the potential gradient between the auxiliary electrode 202 and the extraction electrode 106 is larger than that in the case of FIGS. 4B to 4D, so that all the thermionic electrons are measured. Therefore, the heating temperature is more accurately determined.

FIG. 5B shows an example in which the auxiliary voltage Vs is constant at 0.3 kV, the extraction voltage V1 drops from 2 kV during image observation to −0.1 kV during flashing and then rises to 2 kV again, and the acceleration voltage V0 is constant at 100 kV. The time during which the extraction voltage V1 rises or drops is 1.05 s, the flashing time is 1 s, and the time during which image observation is not performed is 3.1 s, and thus the downtime can be significantly reduced as compared with that of the related art. In this configuration, the extraction power supply 108 is a power supply capable of outputting both positive and negative polarities. During the flashing, the auxiliary voltage Vs is 0.3 kV, the extraction voltage V1 is −0.1 kV, so that all the thermionic electrons are measured. Therefore, the heating temperature is more accurately determined.

Even in Embodiment 4, as shown in FIG. 4C, the auxiliary voltage Vs during the tunnel electron emission (during the image observation) can be made negative. Further, as described with reference to FIG. 4D, the flashing may be performed not only in a period during which the acceleration voltage V0 is changed, but also in a period during which the movement of an observation site, the replacement of the sample 602, the adjustment of a focal position, the adjustment of a voltage or the current applied to each unit, and the like are performed.

As described above, in Embodiment 4, by applying a positive voltage with respect to the tip 101 to the auxiliary electrode 202 and applying a voltage of zero or a negative voltage to the extraction electrode 106, the flashing can be performed while applying the acceleration voltage V0 without a risk of occurrence of stop of the device, deterioration of the pressure of the electron gun, and discharging due to insufficient capacity of the acceleration power supply 111. As a result, the downtime required for flashing can be significantly reduced as compared with the general cold field emitter according to the related art. The auxiliary electrode 202 is caused to collect more thermionic electrons emitted during flashing and the temperature of the tip 101 and the filament 102 is calculated based on the current measured in the auxiliary electrode 202, and thus the temperature during the flashing can be more precisely managed. The residual gas can be appropriately desorbed without blunting the distal end of the tip 101, and thus the reproducibility of the observation image can be improved and the life of the cold field emitter can be extended.

Embodiment 5

Embodiments 1 to 4 have described that thermionic electrons are collected to perform a measurement in the auxiliary electrode 202 by applying a positive voltage to the auxiliary electrode 202 during the flashing. Embodiment 5 describes that thermionic electrons are collected to perform a measurement in the extraction electrode 106 by applying a voltage of zero or a negative voltage to the auxiliary electrode 202 during flashing and controlling the extraction voltage V1 applied to the extraction electrode 106. In Embodiment 5, a part of the configurations and functions described in Embodiments 1 to 4 can be applied, and thus the same configurations and functions are denoted by the same reference numerals and description thereof will be omitted.

An example of a configuration of the cold field emitter 201 and a periphery thereof will be described with reference to FIG. 6. The configuration of the cold field emitter 201 and the periphery thereof is the same as that of Embodiment 1. However, the auxiliary voltage Vs applied to the auxiliary electrode 202 by the auxiliary power supply 204 is zero or a negative voltage, and the ammeter 116 is connected to the extraction electrode 106.

When the auxiliary voltage Vs is a negative voltage, the potential gradient formed between the filament 102 and the auxiliary electrode 202 acts to push back the thermionic electrons emitted from the filament. As a result, the thermionic electrons emitted from the tip 101 and the filament 102 during flashing are only thermionic electrons 301 emitted from the distal end of the tip 101, and are incident on the extraction electrode 106 and are measured by the ammeter 116. That is, the thermionic electrons 205 and the thermionic electrons 206 shown in FIG. 3 cannot be emitted. Even when the auxiliary voltage Vs is zero, the same potential gradient is generated due to the space charge limitation, and the thermionic electrons cannot be emitted. The value measured by the ammeter 116 is transmitted to the control unit 617 and converted into a temperature. When only the thermionic electrons 301 emitted from the distal end of the tip 101 are measured, the temperature of the distal end of the tip 101 is more accurately calculated. The temperature difference between the filament 102 and the distal end of the tip 101 during flashing is about several tens of degrees Celsius to 100 degrees Celsius. In the flashing, it is important to clean the electron emission surface of the distal end of the tip 101, and the temperature of the electron emission surface can be more accurately managed and the reproducibility of the electron emission and the life can be improved by measuring only the thermionic electrons emitted from the distal end of the tip 101 and calculating the temperature.

An example of a potential distribution in a vicinity of the tip 101 will be described with reference to FIG. 7. In FIG.

7, the vicinity of the tip 101 is enlarged, and equipotential lines 303 when the auxiliary voltage Vs is set to −0.2 kV and the extraction voltage V1 is set to 0.3 kV during flashing are indicated by dotted lines. A periphery of the auxiliary electrode 202 to which a negative voltage is applied has a negative potential, and a periphery of the extraction electrode 106 and the aperture 107 to which a positive voltage is applied has a positive potential. A point at which an equipotential line having a zero potential intersects the tip 101 is defined as a boundary point 304. A position of the boundary point 304 changes depending on the auxiliary voltage Vs, the extraction voltage V1, and the protrusion length T of the tip 101.

On the surfaces of the tip 101 and the filament 102, a region above the boundary point 304 is a region 305 covered with a negative potential, and a region below the boundary point 304 is a region 306 covered with a positive potential. The emission of the thermionic electrons is pushed back in the region 305 covered with the negative potential, whereas the thermionic electrons are emitted from the region 306 covered with the positive potential. Most of the thermionic electrons 301 are incident on the extraction electrode 106 and the aperture 107, and most of thermionic electrons 302 pass through the opening of the aperture 107.

When an absolute value of the auxiliary voltage Vs, which is a negative voltage, is increased, the position of the boundary point 304 moves downward, and the thermionic electrons 301 emitted from the tip 101 are reduced. When an absolute value of the extraction voltage V1, which is a positive voltage, is increased, the position of the boundary point 304 moves upward, and the thermionic electrons 301 emitted from the tip 101 increase.

When the amount of current produced by the thermionic electrons 301 is equal to the amount of current produced by the tunnel electrons field-emitted in the steady state, the cost can be reduced and the temperature can be managed without changing the power supply capacity of the extraction power supply 108. The amount of current produced by the tunnel electrons is 1 μA to several hundred μA. The current density of the thermionic electrons emitted during flashing at 2000° C. is about 650 $A/m^2$. In order to set the amount of current produced by the thermionic electrons 301 to 1 μA or more, a surface area of the region 306 covered with the positive potential may be set to 1500 $\mu m^2$ or more. A shape of the distal end of the tip 101 is a cone having a half-top angle of about 10 degrees, and the position of the boundary point 304 may be 50 μm or more from the distal end of the tip 101. When the temperature during the flashing is lower, the current density of the thermionic electrons decreases. Therefore, it is desirable to increase the surface area of the region 306 covered with the positive potential and increase the amount of thermionic electrons that can be measured.

Here, when the flashing is performed while applying the same high extraction voltage V1 as that during field emission, a change in shape called buildup occurs on the electron emission surface of the distal end of the tip 101. This is because, when the tip 101 is heated to 1600° C. or higher under a strong field of $3\times10^9$ V/m, tungsten atoms on the tip surface diffuse and move, and a low-index plane of the crystal grows. When the shape of the distal end changes, the amount of current emitted before and after flashing changes. As a result, the SN ratio and the voltage condition of an observation image change, and the reproducibility of the observation image cannot be obtained.

In addition, compared with the tunnel electrons, the thermionic electrons have low brightness and a large energy width. Accordingly, when the flashing is performed while the field emission is performed, the thermionic electrons are mixed into the tunnel electrons for which the image observation is performed, and thus the decomposition ability of the observation image deteriorates. In order to avoid such buildup and mixing of thermionic electrons, it is required to lower the extraction voltage during flashing and set the field intensity at the distal end of the tip to $3\times10^9$ V/m or less.

The optimum voltage range applied to the auxiliary electrode and the extraction electrode will be described with reference to FIG. 8. FIG. 8 shows an example of a result of calculating, in a manner of satisfying the following conditions, an optimum voltage range 403 applied to both electrodes in a space in which the vertical axis represents the auxiliary voltage Vs and the horizontal axis represents the extraction voltage V1. To calculate the optimum voltage range 403, the protrusion length T of the tip 101 is set to 250 μm, and the distance L between the auxiliary electrode 202 and the extraction electrode 106 is set to 800 μm.

As described with reference to FIG. 7, in order to set the thermionic electrons 301 emitted from the distal end of the tip 101 to 1 μA or more, it is required to set the position of the boundary point 304 where the equipotential line of zero potential intersects the tip 101 to 50 μm or more from the distal end of the tip 101. In order to prevent the distal end of the tip 101 from being built up, it is required to stop the field emission by setting the field intensity of the distal end of the tip 101 during flashing to $3\times10^9$ V/m or less. The auxiliary voltage Vs and the extraction voltage V1 are set in a manner of satisfying these conditions.

A straight line 401 in FIG. 8 represents a combination of the auxiliary voltage Vs and the extraction voltage V1 at which a position of 50 μm from the distal end of the tip 101 has a zero potential. That is, in a region above the straight line 401, a position of 50 μm from the distal end of the tip 101 has a positive potential, and thermionic electrons of 1 μA or more can be measured.

A straight line 402 in FIG. 8 represents a combination of the auxiliary voltage Vs and the extraction voltage V1 at which the field intensity at the distal end of the tip 101 is $3\times10^9$ V/m. Both the straight line 401 and the straight line 402 indicate that the amount of thermionic electrons and the field become constant by increasing the negative auxiliary voltage Vs in accordance with the extraction voltage V1. Here, in a region below the straight line 402, the field intensity of the distal end of the tip 101 is $3\times10^9$ V/m or less, the field emission is stopped, and the buildup does not occur even if the flashing is further performed.

In Embodiment 5, the auxiliary voltage Vs is set to zero or a negative potential, and thus a triangular region surrounded by the line of Vs=0, the straight line 401, and the straight line 402 represents the optimum voltage range 403. When the auxiliary voltage Vs and the extraction voltage V1 are used in the optimum voltage range 403 during the flashing, the temperature of the distal end of the tip 101 can be calculated, the cost of the extraction power supply 108 can be reduced, buildup of the distal end of the tip 101 can be prevented, and mixing of thermionic electrons into tunnel electrons can be prevented. In a region 404 on the right of an intersection point 405 of the straight line 401 and the straight line 402 and below the straight line 401 and above the straight line 402, the amount of the thermionic electrons 301 is insufficient, the temperature of the flashing cannot be managed, the distal end of the tip 101 is built up, and the thermionic electrons are mixed into the tunnel electrons. Therefore, the region 404 can be said to be an inappropriate voltage range.

The optimum voltage range applied to the auxiliary electrode and the extraction electrode when the protrusion length T of the tip is changed will be described with reference to FIG. 9. FIG. 9 shows an example of a calculation result of an optimum voltage range 504 when the protrusion length T is changed from 50 μm to 750 μm. To calculate the optimum voltage range 504, the distance L between the auxiliary electrode 202 and the extraction electrode 106 is set to 800 μm.

As described with reference to FIG. 8, the optimum voltage range 504 is a region surrounded by a line of Vs=0, a straight line at which a position of 50 μm from the distal end of the tip 101 is a zero potential, and a straight line at which the field intensity at the distal end of the tip 101 is $3\times10^9$ V/m. When the protrusion length T changes, two straight lines other than the line of Vs=0 also change, and the two straight lines are shifted in the upper right direction as the protrusion length T decreases. When T is equal to 50 μm, a straight line 501 at which the field intensity at the distal end of the tip 101 is $3\times10^9$ V/m is represented by Vs=−0.150V1+1.18. When T is equal to 650 μm, a straight line 502 at which the position of 50 μm from the distal end of the tip 101 has a zero potential is represented by Vs=−5.49V1. An intersection point of the two straight lines moves on a curve 503 expressed by Vs=−146/(V1−4.13)+6.40.

Accordingly, even when the protrusion length T is changed, by using the auxiliary voltage Vs and the extraction voltage V1 in the optimum voltage range 504 during flashing, the temperature of the distal end of the tip 101 can be accurately calculated, and the cost of the extraction power supply 108 can be reduced. The distal end of the tip 101 can be prevented from being built up, and thermionic electrons can be prevented from being mixed into the tunnel electrons. Even when the distance L between the auxiliary electrode 202 and the extraction electrode 106 is another length, for example, 400 μm to 600 μm, the same effect can be obtained by using the auxiliary voltage Vs and the extraction voltage V1 in the optimum voltage range 504 during the flashing. The optimum voltage range 504 is represented by a region satisfying −5.49V1≤Vs≤−0.150V1+1.18 and −146/(V1−4.13)+6.40≤Vs≤0 (unit: kV).

As described above, in Embodiment 5, the temperature of the distal end of the tip during the flashing can be more precisely managed by applying a voltage of zero or a negative voltage with respect to the tip 101 to the auxiliary electrode 202, controlling the extraction voltage V1 applied to the extraction electrode 106, and collecting thermionic electrons by the extraction electrode 106 to perform the measurement. The residual gas can be appropriately desorbed without blunting the distal end of the tip 101, and thus the reproducibility of the observation image can be improved and the life of the cold field emitter can be extended. In addition, buildup on the electron emission surface at the distal end of the tip 101 is prevented, and mixing of thermionic electrons into tunnel electrons used for image observation is prevented, thereby improving reproducibility of an observation image.

Embodiment 6

Embodiment 5 has described that thermionic electrons are collected to perform a measurement in the extraction electrode 106 by applying a voltage of zero or a negative voltage to the auxiliary electrode 202 during flashing and controlling the extraction voltage V1 applied to the extraction electrode 106. Embodiment 6 further describes that the downtime of the device is further reduced by applying the acceleration voltage V0 during the flashing. In Embodiment 6, a part of the configurations and functions described in Embodiments 1 to 5 can be applied, and thus the same configurations and functions are denoted by the same reference numerals and description thereof will be omitted.

Of the thermionic electrons shown in FIG. 7, a very small part of the thermionic electrons 302 in a vicinity of a central axis pass through the aperture 107 and enter the acceleration space 112. The amount of current of the thermionic electrons is about the same as that of tunnel electrons used for image observation in a steady state. Therefore, even if flashing is performed while applying the voltage V0, a failure due to shortage of the power supply capacity of the acceleration power supply 111 does not occur. In addition, the possibility that the vacuum degree of the electron gun deteriorates or the electron source is damaged is also low. Accordingly, flashing can be performed while applying the acceleration voltage V0, and the downtime can be reduced.

An example of a change in a voltage applied to each electrode will be described with reference to FIGS. 10A to 10D. FIG. 10A shows an example in which the auxiliary voltage Vs is constant at −0.2 kV, the extraction voltage V1 drops from 2 kV during image observation to 0.3 kV during flashing and then rises to 2 kV again, and the acceleration voltage V0 is constant at 100 kV. The time during which the extraction voltage V1 rises or drops is 0.85 s, the time during which the extraction voltage V1 is maintained at 0.3 kV during flashing is 1 s, and the time during which image observation is not performed is limited to 2.7 s. The auxiliary voltage Vs is constant at −0.2 kV, and thus the thermionic electrons are not emitted from the filament 102 but emitted only from the distal end of the tip 101. As a result, the temperature of the distal end of the tip 101 can be more accurately calculated. In addition, buildup and mixing of thermionic electrons into tunnel electrons do not occur.

FIG. 10 shows an example in which the auxiliary voltage Vs is 0.3 kV during image observation and 0 kV during flashing, the extraction voltage V1 is 2 kV during the image observation and 0.1 kV during the flashing, and the acceleration voltage V0 is constant at 100 kV. The time during which the auxiliary voltage Vs and the extraction voltage V1 are raised or dropped is 0.95 s, the time during which flashing is performed is 1 s, and the time during which image observation is not performed is limited to 2.9 s. In addition, the auxiliary voltage Vs during the flashing is −0.2 kV, no thermionic electrons are emitted from the filament 102, and only the thermionic electrons 301 emitted from the distal end of the tip 101 are measured, and thus the temperature of the distal end of the tip 101 can be more accurately calculated. In addition, buildup and mixing of thermionic electrons into tunnel electrons do not occur.

FIG. 10C shows an example in which the auxiliary voltage Vs is −0.2 kV during image observation and −1.3 kV during flashing, the extraction voltage V1 is constant at 2 kV, and the acceleration voltage V0 is constant at 100 kV. The time during which the auxiliary voltage Vs rises or drops is 0.55 s, the time during which flashing is performed is 1 s, and the time during which image observation is not performed is limited to 2.1 s. In addition, the auxiliary voltage Vs during the flashing is −1.3 kV, no thermionic electrons are emitted from the filament 102, and only the thermionic electrons 301 emitted from the distal end of the tip 101 are measured, and thus the temperature of the distal end of the tip 101 can be more accurately calculated. The extraction voltage V1 is constant, and thus the discharging caused by the voltage rise and drop of V1 is less likely to occur. In addition, buildup and mixing of thermionic electrons into tunnel electrons do not occur.

FIG. 10D shows an example in which the auxiliary voltage Vs is 1 kV during image observation and −0.6 kV during flashing, the extraction voltage V1 is constant at 1 kV, and the acceleration voltage V0 is constant at 100 kV. The time during which the auxiliary voltage Vs rises or drops is 0.8 s, the time during which flashing is performed is 1 s, and the time during which image observation is not performed is limited to 2.6 s. In addition, the auxiliary voltage Vs during the flashing is −0.6 kV, no thermionic electrons are emitted from the filament 102, and only the thermionic electrons 301 emitted from the distal end of the tip 101 are measured, and thus the temperature of the distal end of the tip 101 can be more accurately calculated. The extraction voltage V1 is constant, and thus the discharging is less likely to occur. In addition, buildup and mixing of thermionic electrons into tunnel electrons do not occur.

As described above, in Embodiment 6, the temperature of the distal end of the tip during the flashing can be more precisely managed by applying a voltage of zero or a negative voltage with respect to the tip 101 to the auxiliary electrode 202, controlling the extraction voltage V1 applied to the extraction electrode 106, and collecting thermionic electrons by the extraction electrode 106 to perform the measurement. In addition, there is no risk of occurrence of stop of the device, deterioration of the pressure of the electron gun, and discharging due to the insufficient capacity of the acceleration power supply 111, and the flashing can be performed while the acceleration voltage V0 is applied. As a result, the downtime required for flashing can be significantly reduced as compared with the general cold field emitter according to the related art. The residual gas can be appropriately desorbed without blunting the distal end of the tip 101, and thus the reproducibility of the observation image can be improved and the life of the cold field emitter can be extended. In addition, buildup on the electron emission surface at the distal end of the tip 101 is prevented, and mixing of thermionic electrons into tunnel electrons used for image observation is further prevented, thereby improving reproducibility of an observation image.

A plurality of embodiments of the invention have been described above. The invention is not limited to the above embodiments, and can be embodied by modifying components without departing from the gist of the invention. For example, instead of the tungsten single crystal, a material having an inactive surface, such as a low-work function material such as $CeB_6$ or $LaB_6$ or a carbon-coated material, may be used as the tip 101. In addition, a nanowire electron source or a monatomic electron source may be used in which the curvature radius is pointed from several tens of nanometers or several atoms to about one atom. A plurality of components disclosed in the above embodiments may be combined appropriately. Further, some components may be deleted from all the components shown in the above embodiments.

REFERENCE SIGNS LIST

101: tip
102: filament
103: pin
104: insulator
106: extraction electrode
107: aperture
108: extraction power supply
109: acceleration electrode
110: aperture
111: acceleration power supply
112: acceleration space
113: flashing power supply
116: ammeter
201: cold field emitter
202: auxiliary electrode
203: opening
204: auxiliary power supply
205: thermionic electron
206: thermionic electron
207: thermionic electron
208: thermionic electron
301: thermionic electron
302: thermionic electron
303: equipotential line
304: boundary point
305: region covered with negative potential
306: region covered with positive potential
401: straight line
402: straight line
403: optimum voltage range
404: region
405: intersection point
501: straight line
502: straight line
503: curve
504: optimum voltage range
601: electron beam
602: sample
603: tubular body
604: sample chamber
605: first vacuum chamber
606: second vacuum chamber
607: third vacuum chamber
608: ion pump
609: non-evaporable getter pump
610: insulator
611: ion pump
612: condenser lens
613: turbomolecular pump
614: objective lens
616: detector
617: control unit
618: display unit
619: input unit

The invention claimed is:

1. A charged particle beam device comprising:

a cold field emitter including a tip having a sharpened distal end, a filament connected to the tip, and an auxiliary electrode covering the filament and having an opening from which the tip protrudes;

an extraction electrode to which an extraction voltage for extracting electrons from the cold field emitter is applied;

an acceleration electrode to which an acceleration voltage for accelerating the electrons extracted from the cold field emitter is applied;

a power supply configured to apply a positive voltage to the auxiliary electrode with respect to the tip; and a current detector coupled to the auxiliary electrode and configured to measure a current caused by thermionic electrons emitted from the tip and the filament, when the tip and the filament are heated, that are collected by the auxiliary electrode during application of the positive voltage by the power supply.

2. The charged particle beam device according to claim 1, wherein the auxiliary voltage applied to the auxiliary electrode is larger than the extraction voltage when the tip and the filament are heated.

3. The charged particle beam device according to claim 2, wherein the extraction voltage is set to zero or a negative voltage when the tip and the filament are heated.

4. The charged particle beam device according to claim 3, wherein the acceleration voltage is applied when the tip and the filament are heated.

5. The charged particle beam device according to claim 1, wherein the power supply is configured to apply both positive and negative voltages to the auxiliary electrode with respect to the tip during image observation.

6. The charged particle beam device according to claim 1, wherein the tip and the filament are heated during a period in which any one of a change in the acceleration voltage, a movement of an observation site, replacement of a sample, adjustment of a focal position, and adjustment of a voltage or a current applied to each unit is performed.

7. The charged particle beam device according to claim 6, wherein the acceleration voltage is applied when the tip and the filament are heated.

8. The charged particle beam device according to claim 1, further comprising:

a display unit configured to display at least one of the acceleration voltage, the extraction voltage, the auxiliary voltage applied to the auxiliary electrode, the current measured in the auxiliary electrode, a calculated temperature, a current supplied to the filament, and a time during which the current is supplied to the filament when the tip and the filament are heated.

9. The charged particle beam device according to claim 8, wherein the acceleration voltage is applied when the tip and the filament are heated.

10. The charged particle beam device according to claim 1, further comprising:

a control unit configured to record at least one of the acceleration voltage, the extraction voltage, the auxiliary voltage applied to the auxiliary electrode, the current measured in the auxiliary electrode, a calculated temperature, a current supplied to the filament, and a time during which the current is supplied to the filament when the tip and the filament are heated.

11. The charged particle beam device according to claim 1, wherein the acceleration voltage is applied when the tip and the filament are heated.

12. A charged particle beam device comprising:

a cold field emitter including a tip having a sharpened distal end, a filament connected to the tip, and an auxiliary electrode covering the filament and having an opening from which the tip protrudes;

an extraction electrode to which an extraction voltage for extracting electrons from the cold field emitter is applied; and an acceleration electrode to which an acceleration voltage for accelerating the electrons extracted from the cold field emitter is applied;

a power supply configured to apply an auxiliary voltage Vs to the auxiliary electrode and an extraction voltage V1 to the extraction electrode; and a current detector coupled to the extraction electrode and configured to, when the tip and the filament are heated, measure a current in the extraction electrode caused by thermionic electrons emitted from the tip in a state in which $-5.49V1 \leq Vs \leq -0.150V1+1.18$, and $-146/(V1-4.13)+6.40 \leq Vs \leq 0$.

13. The charged particle beam device according to claim 12, wherein the acceleration voltage is applied when the tip and the filament are heated.

14. A charged particle beam device comprising:

a cold field emitter including a tip having a sharpened distal end, a filament connected to the tip, and an auxiliary electrode covering the filament and having an opening from which the tip protrudes;

an extraction electrode to which an extraction voltage for extracting electrons from the cold field emitter is applied; and an acceleration electrode to which an acceleration voltage V0 (kV) for accelerating the electrons extracted from the cold field emitter is applied;

a power supply configured to apply an auxiliary voltage to the auxiliary electrode and an extraction voltage to the extraction electrode; and a control unit configured to control an operation of the cold field emitter, the extraction electrode, the acceleration electrode and the power supply, wherein the control unit is further configured to:

control the power supply to apply the auxiliary voltage to be larger than the extraction voltage when the tip and the filament are heated;

control the power supply to apply the acceleration voltage when the tip and the filament are heated; and control an observation stop time when the tip and the filament are heated to be V0 (sec) or shorter.

15. A charged particle beam device comprising:

a cold field emitter including a tip having a sharpened distal end, a filament connected to the tip, and an auxiliary electrode covering the filament and having an opening from which the tip protrudes;

an extraction electrode to which an extraction voltage for extracting electrons from the cold field emitter is applied;

an acceleration electrode to which an acceleration voltage for accelerating the electrons extracted from the cold field emitter is applied;

a control unit configured to control an operation of the cold field emitter, the extraction electrode and the acceleration electrode;

a power supply configured to apply a positive voltage to the auxiliary electrode with respect to the tip; and a current detector coupled to the auxiliary electrode and configured to measure a current in the auxiliary electrode caused by thermionic electrons emitted from the tip and the filament, when the tip and the filament are heated, that are collected by the auxiliary electrode during application of the positive voltage by the power supply, wherein the control unit is configured to convert the measured current into a temperature.

16. The charged particle beam device according to claim 15, wherein the auxiliary voltage applied to the auxiliary electrode is larger than the extraction voltage when the tip and the filament are heated.

17. The charged particle beam device according to claim 16, wherein the extraction voltage is set to zero or a negative voltage when the tip and the filament are heated.

18. The charged particle beam device according to claim 15, wherein the power supply is configured to apply both positive and negative voltages to the auxiliary electrode with respect to the tip during image observation.

19. The charged particle beam device according to claim 15, wherein the tip and the filament are heated during a period in which any one of a change in the acceleration voltage, a movement of an observation site, replacement of a sample, adjustment of a focal position, and adjustment of a voltage or a current applied to each unit is performed.

20. The charged particle beam device according to claim 15, further comprising:

a display unit configured to display at least one of the acceleration voltage, the extraction voltage, the auxiliary voltage applied to the auxiliary electrode, the current measured in the auxiliary electrode, a calculated temperature, a current supplied to the filament, and a time during which the current is supplied to the filament when the tip and the filament are heated.

21. The charged particle beam device according to claim 15, further comprising:

a control unit configured to record at least one of the acceleration voltage, the extraction voltage, the auxiliary voltage applied to the auxiliary electrode, the current measured in the auxiliary electrode, a calculated temperature, a current supplied to the filament, and a time during which the current is supplied to the filament when the tip and the filament are heated.

22. The charged particle beam device according to claim 15, wherein the acceleration voltage is applied when the tip and the filament are heated.

* * * * *